US006936961B2

(12) United States Patent
Liao et al.

(10) Patent No.: US 6,936,961 B2
(45) Date of Patent: Aug. 30, 2005

(54) CASCADED ORGANIC ELECTROLUMINESCENT DEVICE HAVING CONNECTING UNITS WITH N-TYPE AND P-TYPE ORGANIC LAYERS

(75) Inventors: Liang-Sheng Liao, Rochester, NY (US); Kevin P. Klubek, Webster, NY (US); Dustin L. Comfort, Webster, NY (US); Ching W. Tang, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 238 days.

(21) Appl. No.: 10/437,195

(22) Filed: May 13, 2003

(65) Prior Publication Data

US 2004/0227460 A1 Nov. 18, 2004

(51) Int. Cl.[7] .................................................. H01J 1/62
(52) U.S. Cl. ........................ 313/506; 313/503; 313/504; 313/429
(58) Field of Search ................................ 313/503, 504, 313/506, 429; 428/690, 917; 257/40, 59, 347; 345/48, 76

(56) References Cited

U.S. PATENT DOCUMENTS

| | | | |
|---|---|---|---|
| 4,769,292 A | | 9/1988 | Tang et al. |
| 5,703,436 A | | 12/1997 | Forrest et al. |
| 5,837,391 A | * | 11/1998 | Utsugi .......................... 428/690 |
| 6,107,734 A | | 8/2000 | Tanaka et al. |
| 6,232,714 B1 | * | 5/2001 | Shen et al. .................. 313/506 |
| 6,274,980 B1 | | 8/2001 | Burrows et al. |
| 6,337,492 B1 | * | 1/2002 | Jones et al. .................... 257/40 |

OTHER PUBLICATIONS

"Ion–beam–induced surface damages on tris–(8–hydroxyquinoline) aluminum" by L. s. Liao, Applied Physics Letters, vol. 75, No. 11, Sep. 13, 1999, pp. 1619–1621.

"Electroluminescence of doped organoic thin films" by C. w. Tang et al., J. Appl. Phys. 65(9), May 1, 1989, pp. 3610–3616.

"Organic electroluminescent diodes" by C. W. Tang et al., Appl. Phys. Lett. 51 (12), Sep. 21, 1987, pp. 913–915.

"Electroluminescence in organic films with three–layer structure", by Chihaya Adachi, et al., Japanese Journal of Applied Physics, vol. 27, No. 2, Feb. 1988, pp. L269–L271.

* cited by examiner

Primary Examiner—Ashok Patel
Assistant Examiner—Anthony Canning
(74) Attorney, Agent, or Firm—Raymond L. Owens

(57) ABSTRACT

A cascaded organic electroluminescent device includes an anode and a cathode. The device also includes a plurality of organic electroluminescent units disposed between the anode and the cathode, wherein the organic electroluminescent units comprise at least a hole-transporting layer, an electron-transporting layer, and an electroluminescent zone formed between the hole-transporting layer and the electron-transporting layer wherein the physical spacing between adjacent electroluminescent zones is more than 90 nm; and a connecting unit disposed between each adjacent organic electroluminescent unit, wherein the connecting unit comprises, in sequence, an n-type doped organic layer and a p-type doped organic layer forming a transparent p-n junction structure wherein the resistivity of each of the doped layers is higher than 10 Ω-cm.

10 Claims, 3 Drawing Sheets

CASCADED ORGANIC ELECTROLUMINESCENT DEVICE HAVING CONNECTING UNITS WITH N-TYPE AND P-TYPE ORGANIC LAYERS

CROSS-REFERENCE TO RELATED APPLICATION

Reference is made to commonly assigned U.S. patent application Ser. No. 10/077,270 filed Feb. 15, 2002 by Liang-Sheng L. Liao et al., entitled "Providing an Organic Electroluminescent Device Having Stacked Electroluminescent Units", the disclosure of which is herein incorporated by reference.

FIELD OF INVENTION

The present invention relates to providing a plurality of organic electroluminescent (EL) units to form a cascaded organic electroluminescent device.

BACKGROUND OF THE INVENTION

Organic electroluminescent (EL) devices or organic light-emitting devices (OLEDs) are electronic devices that emit light in response to an applied potential. The structure of an OLED comprises, in sequence, an anode, an organic EL medium, and a cathode. The organic EL medium disposed between the anode and the cathode is commonly comprised of an organic hole-transporting layer (HTL) and an organic electron-transporting layer (ETL). Holes and electrons recombine and emit light in the ETL near the interface of HTL/ETL. Tang et al. ["Organic Electroluminescent Diodes", *Applied Physics Letters*, 51, 913 (1987), and commonly assigned U.S. Pat. No. 4,769,292] demonstrated highly efficient OLEDs using such a layer structure. Since then, numerous OLEDs with alternative layer structures have been disclosed. For example, there are three-layer OLEDs that contain an organic light-emitting layer (LEL) between the HTL and the ETL, such as that disclosed by Adachi et al., "Electroluminescence in Organic Films with Three-Layer Structure", *Japanese Journal of Applied Physics*, 27, L269 (1988), and by Tang et al., "Electroluminescence of Doped Organic Thin Films", *Journal of Applied Physics*, 65, 3610 (1989). The LEL commonly consists of a host material doped with a guest material. Wherein the layer structures are denoted as HTL/LEL/ETL, Further, there are other multilayer OLEDs that contain a hole-injecting layer (HIL), and/or an electron-injecting layer (EIL), and/or a hole-blocking layer, and/or an electron-blocking layer in the devices. These structures have further resulted in improved device performance.

Moreover, in order to further improve the performance of the OLEDs, a new kind of OLED structure called stacked OLED (or cascaded OLED), which is fabricated by stacking several individual OLEDs vertically, has also been proposed. Forrest et al. in U.S. Pat. No. 5,703,436 and Burrows et al. in U.S. Pat. No. 6,274,980 disclosed their stacked OLEDs. In their inventions, the stacked OLEDs are fabricated by vertically stacking several OLEDs, each independently emitting light of a different color or of the same color. They believe that by using their stacked OLED structure, full color emission devices with higher integrated density in the display could be made. However, each OLED unit in their devices needs a separate power source. In an alternative design, Tanaka et al. in U.S. Pat. No. 6,107,734 and Jones et al. in U.S. Pat. No. 6,337,492 proposed a stacked OLED structure by vertically stacking several OLEDs without individually addressing each OLED unit in the stack. Tanaka et al. indicated that their stacked structure could increase the luminance output or operational lifetime.

The aforementioned stacked OLEDs use metals, metal alloys, or other inorganic compounds as intermediate electrodes, with the electrical resistivity lower than 0.1 $\Omega$-cm, to connect each individual OLED unit in the stacked OLED. These device architectures present serious fabrication difficulties. First, the fabrication of the intermediate electrodes, such as an In—Zn—O oxide film or an In—Sn—O oxide film, is an ion-sputtering process. This method will cause damage on organic surfaces [Liao et al., "Ion-beam-induced surface damages on tris-(8-hydroxyquinoline) aluminum", *Applied Physics Letters*, 75, 1619 (1999)]. Second, due to their thickness limitation, these electrodes cannot be used as spacers to adjust the light reflecting length in the device for improving light extraction. Third, if an intermediate electrode is a discontinuous layer, its carrier injecting ability will be inferior, rendering poor EL performance. If the intermediate electrode is a continuous thicker layer, it will have high lateral conductivity resulting in severe pixel cross-talk, and will have low optical transparency resulting in reduced light extraction. (Pixel cross-talk means that the pixels adjacent to a lit pixel emit unwanted light due to high lateral conductivity). In the prior art, either a shadow mask is used for pixelization of each intermediate electrode or an insulating layer is deposited to define each pixel on the substrate at an early step in the OLED fabrication. Both of the methods would be complicated, resulting in low production yield.

SUMMARY OF THE INVENTION

It is an object of the present invention to make a cascaded OLED with improved light extraction that is easy to fabricate.

It is another object of the present invention to make a cascaded OLED with lower cost and higher production yield.

These objects are achieved by a cascaded organic electroluminescent device comprising:

a) an anode;

b) a cathode;

c) a plurality of organic electroluminescent units disposed between the anode and the cathode, wherein the organic electroluminescent units comprise at least a hole-transporting layer, an electron-transporting layer, and an electroluminescent zone formed between the hole-transporting layer and the electron-transporting layer wherein the physical spacing between adjacent electroluminescent zones is more than 90 nm; and d) a connecting unit disposed between each adjacent organic electroluminescent unit, wherein the connecting unit comprises, in sequence, an n-type doped organic layer and a p-type doped organic layer forming a transparent p-n junction structure wherein the resistivity of each of the doped layers is higher than 10 $\Omega$-cm.

ADVANTAGEOUS EFFECT OF THE INVENTION

An advantage of the present invention is that it enables a cascaded OLED to function with improved light extraction by adjusting the physical spacing between adjacent electroluminescent zones. A further feature is that the thickness of the doped organic p-n junction structure can be adjusted to change the physical spacing between adjacent electroluminescent zones without significantly changing the driving voltage and the transparency in the emissive spectral range.

Another advantage of the present invention is that it enables a cascaded OLED to function with a doped organic p-n junction structure, thereby simplifying the fabrication steps.

Another advantage of the present invention is that it enables a cascaded OLED to function with a doped organic p-n junction structure, thereby reducing the fabrication cost and increasing the production yield.

Another advantage of the present invention is that the cascaded OLED provides significantly improved luminance efficiency compared to a conventional non-cascaded OLED.

Another advantage of the present invention is that the cascaded OLED has an increased brightness if operated under the same current as that of a conventional OLED.

Another advantage is that the cascaded OLED has an increased lifetime if operated under the same brightness as that of a conventional OLED.

Another advantage of the present invention is that the cascaded OLED can be operated with a single voltage source with only two electrical bus conductors connecting the device to an external circuit. Thus its device architecture is significantly less complex than those reported in the prior art.

Another advantage of the present invention is that the cascaded OLED can have the emission color adjusted by mixing appropriate organic electroluminescent units for different color emissions.

Another advantage of the present invention is that high efficiency white electroluminescence can be produced.

Another advantage of the present invention is that the cascaded OLED can be effectively used in a lamp.

Figure 1:
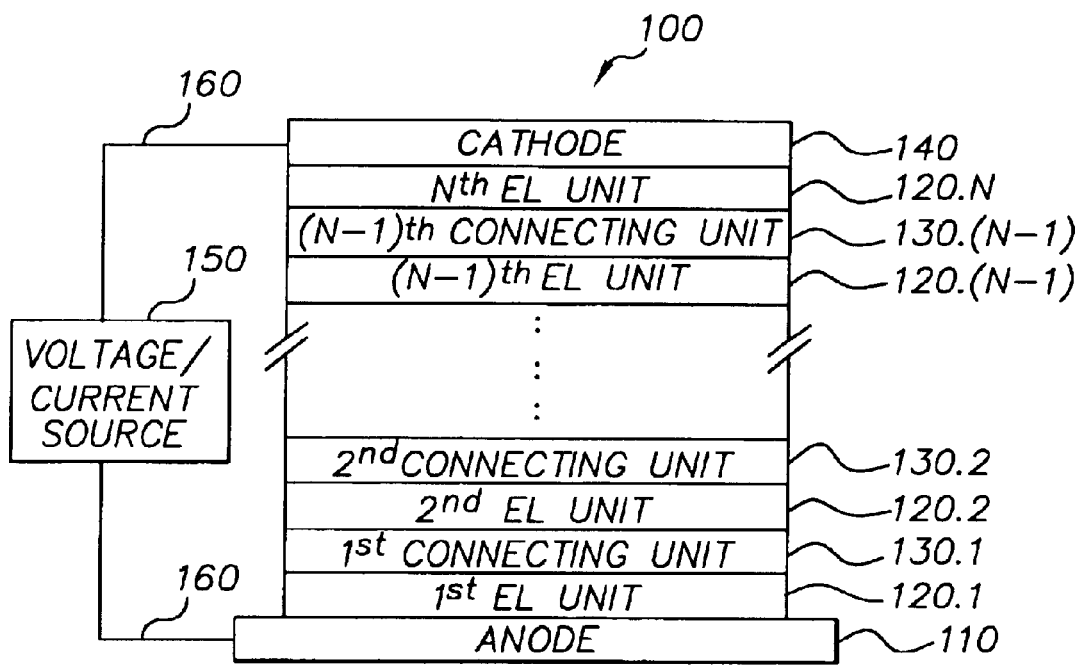
FIG. 1 depicts a schematic cross sectional view of a cascaded OLED in accordance with the present invention, having a plurality of organic EL units and having a connecting unit in between each of the organic EL units.
Figure 2:
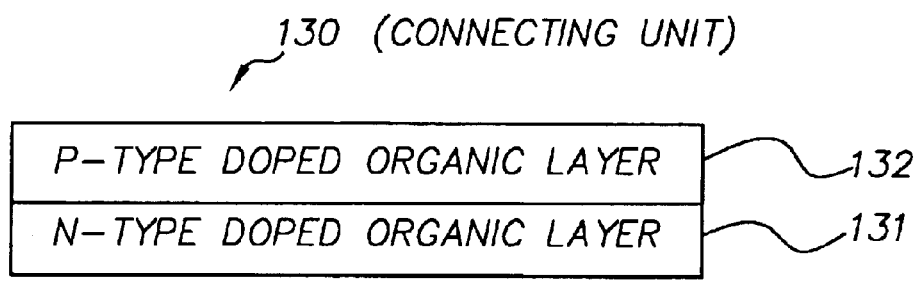
FIG. 2 depicts a schematic cross sectional view of a connecting unit having an n-type doped organic layer and a p-type doped organic layer useful in the cascaded OLED in accordance with the present invention.
Figure 3:
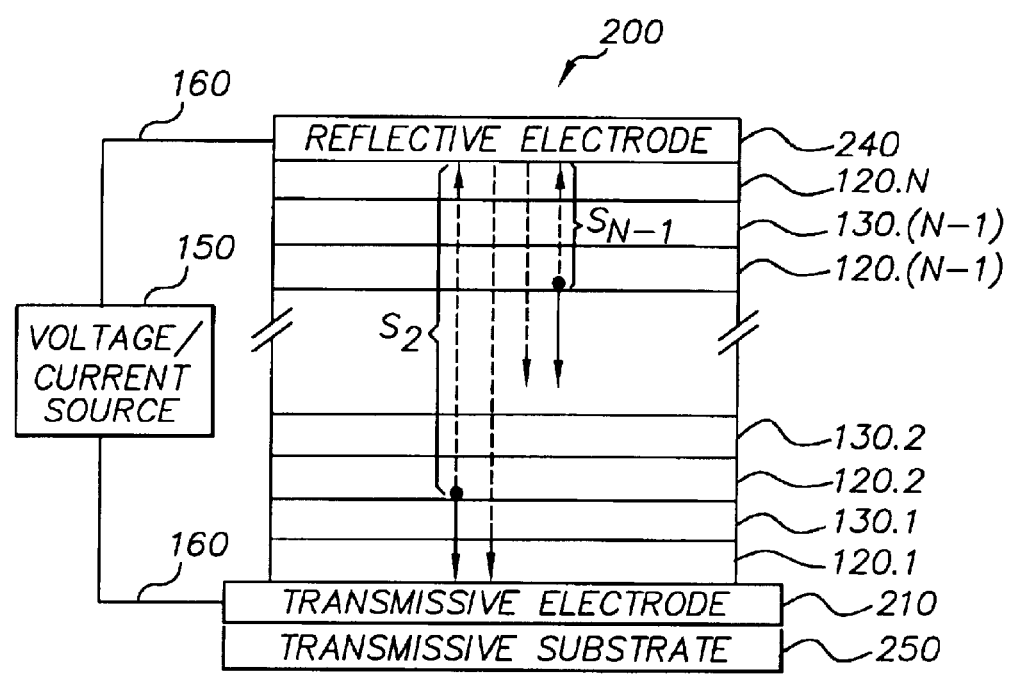
FIG. 3 depicts a schematic cross sectional view of a cascaded OLED in accordance with the present invention, showing the dual-path interference between the direct beams and the reflected beams from some of the electroluminescent zones.

It will be understood that FIGS. 1–3 are not to scale since the individual layers are too thin and the thickness differences of various layers too great to permit depiction to scale.

DETAILED DESCRIPTION OF THE INVENTION

In commonly assigned U.S. patent application Ser. No. 10/077,270 filed Feb. 15, 2002 by Liang-Sheng L. Liao et al., entitled "Providing an Organic Electroluminescent Device Having Stacked Electroluminescent Units", the disclosure of which is herein incorporated by reference, the layer structure of a cascaded OLED (or stacked OLED) has been disclosed. The device structure comprises an anode, a cathode, a plurality of organic EL units and a plurality of organic connectors (or connecting units thereafter), wherein each of the connecting units is disposed between two organic EL units. In this cascaded device structure only a single external power source is needed to connect to the anode and the cathode with the positive potential applied to the anode and the negative potential to the cathode. With good optical transparency and charge injection, the cascaded device exhibits high electroluminescence efficiency.

The present invention further improves the performance of the cascaded OLED by specifying the properties of the connecting units in the device.

General Device Architecture

FIG. 1 shows a cascaded OLED 100 in accordance with the present invention. This cascaded OLED has an anode 110 and a cathode 140, at least one of which is transparent. Disposed between the anode and the cathode are N organic EL units 120, where N is an integer greater than 1. These organic EL units, cascaded serially to each other and to the anode and the cathode, are designated 120.1 to 120.N where 120.1 is the first EL unit (adjacent to the anode) and 120.N is the $N^{th}$ unit (adjacent to the cathode). The term EL unit 120 represents any of the EL units named from 120.1 to 120.N in the present invention. When N is greater than 2, there are organic EL units not adjacent to the anode or cathode, and these can be referred to as intermediate organic EL units. Disposed between any two adjacent organic EL units is a connecting unit 130. There are a total of N−1 connecting units associated with N organic EL units and they are designated 130.1 to 130.(N−1). Connecting unit 130.1 is disposed between organic EL units 120.1 and 120.2, and connecting unit 130.(N−1) is disposed between organic EL units 120.(N−1) and 120.N. The term connecting unit 130 represents any of the connecting units named from 130.1 to 130.(N−1) in the present invention. The cascaded OLED 100 is externally connected to a voltage/current source 150 through electrical conductors 160.

Cascaded OLED 100 is operated by applying an electric potential generated by a voltage/current source 150 between a pair of contact electrodes, anode 110 and cathode 140, such that anode 110 is at a more positive potential with respect to the cathode 140. This externally applied electrical potential is distributed among the N organic EL units in proportion to the electrical resistance of each of these units. The electric potential across the cascaded OLED causes holes (positively charged carriers) to be injected from anode 110 into the $1^{st}$ organic EL unit 120.1, and electrons (negatively charged carriers) to be injected from cathode 140 into the $N^{th}$ organic EL unit 120.N. Simultaneously, electrons and holes are generated in, and separated from, each of the connecting units (130.1–130.(N−1)). Electrons thus generated in, for example, connecting unit 130.(N−1) are injected towards the anode and into the adjacent organic EL unit 120.(N−1). Likewise, holes generated in the connecting unit 130.(N−1) are injected towards the cathode and into the adjacent organic EL unit 120.N. Subsequently, these electrons and holes recombine in their corresponding organic EL units to produce light, which is observed via the transparent electrode or electrodes of the OLED. In other words, the electrons injected from the cathode are energetically cascading from the $N^{th}$ organic EL unit to the $1^{st}$ organic EL unit, and emit light in each of the organic EL units. Therefore, it is preferred to use the term "cascaded OLED" instead of "stacked OLED" in the present invention.

Particular Device Features
  Organic EL Units

The same as in commonly assigned U.S. patent application Ser. No. 10/077,270 filed Feb. 15, 2002 by Liang-Sheng L. Liao et al., entitled "Providing an Organic Electroluminescent Device Having Stacked Electroluminescent Units", the disclosure of which is herein incorporated by reference, each organic EL unit 120 in the cascaded OLED 100 is capable of supporting hole and electron-transport, and electron-hole recombination to produce light. Each organic EL unit 120 can comprise a plurality of layers. There are many organic EL multilayer structures known in the art that can be used as the organic EL unit of the present invention. These include HTL/ETL, HTL/LEL/ETL, HIL/HTL/LEL/ETL, HIL/HTL/LEL/ETL/EIL, HIL/HTL/electron-blocking layer or hole-blocking layer/LEL/ETL/EIL, HIL/HTL/LEL/hole-blocking layer/ETL/EIL. Each organic EL unit in the cascaded OLED can have the same or different layer structures from other organic EL units. The layer structure of the $1^{st}$ organic EL unit adjacent to the anode preferably is of HIL/HTL/LEL/ETL, and the layer structure of the $N^{th}$ organic EL unit adjacent to the anode preferably is of HTL/LEL/ETL/EIL, and the layer structure of the intermediate organic EL units preferably is of HTL/LEL/ETL. In any of the EL units, an electroluminescent zone can be formed between the HTL and the ETL, within the ETL or within the LEL. Typically, the thickness of the electroluminescent zone is in the range of from 5 nm to 35 nm. The present invention preferably defines the thickness of the electroluminescent zone as 10 nm starting at the HTL/LEL interface and ending within the LEL The organic layers in the organic EL unit 120 can be formed from small molecule OLED materials or polymeric LED materials, both known in the art, or combinations thereof. The corresponding organic layer in each organic EL unit in the cascaded OLED can be the same or different from other corresponding organic layers. Some organic EL units can be polymeric and other units can be of small molecules.

Each organic EL unit can be selected in order to improve performance or achieve a desired attribute, for example, light transmission through the OLED multilayer structure, driving voltage, luminance efficiency, light emission color, manufacturability, device stability, and so forth.

In order to minimize driving voltage for the cascaded OLED, it is desirable to make each organic EL unit as thin as possible without compromising the electroluminescence efficiency. It is preferable that each organic EL unit is less than 500 nm thick, and more preferable that it be 2–200 nm thick. It is also preferable that each layer within the organic EL unit be 200 nm thick or less, and more preferable that it be 0.1–100 nm.

The number of organic EL units in the cascaded OLED is, in principle, equal to or more than 2. Preferably, the number of the organic EL units in the cascaded OLED is such that the luminance efficiency in units of cd/A is improved or maximized. For lamp applications, the number of organic EL units may be determined according to the maximum voltage of the power supply.

Connecting Units

As is well known, the conventional OLED comprises an anode, an organic medium, and a cathode. In the present invention, the cascaded OLED comprises an anode, a plurality of organic EL units, a plurality of connecting units, and a cathode, wherein the connecting unit is a new feature for cascaded OLEDs.

For a cascaded OLED to function efficiently, it is necessary that the optical transparency of the layers constituting the organic EL units and the connecting units be as high as possible to allow for radiation generated in the organic EL units to exit the device. The layers constituting the organic EL units are generally optically transparent to the radiation generated by the EL units, and therefore their transparency is generally not a concern for the construction of the cascaded OLEDs. However, if metals, metal alloys, or other inorganic compounds are used as intermediate electrodes or connecting units to connect each individual organic EL unit, it will be difficult to obtain a high transparency. According to a simple calculation, if the optical transmission of each connecting unit is 70%, cascaded OLED will not have much benefit because no matter how many EL units are in the device, the electroluminance efficiency can never be doubled when compare to a conventional device. If the layers constituting the connecting units are constructed from selected organic materials and appropriate n-type or p-type dopants, it is then easy to have their optical transmission be higher than 90%.

Another requirement for the cascaded OLED to function efficiently is that the connecting unit should provide electron injection into the electron-transporting layer and hole injection into the hole-transporting layer of the two adjacent organic EL units. The construction of such a connecting unit capable of providing good electron and hole injection has also been disclosed in commonly assigned U.S. patent application Ser. No. 10/077,270 filed Feb. 15, 2002 by Liang-Sheng L. Liao et al., entitled "Providing an Organic Electroluminescent Device Having Stacked Electroluminescent Units", the disclosure of which is herein incorporated by reference. However, in the present invention, it is preferred to use a connecting unit comprising both an n-type doped organic layer and a p-type doped organic layer.

Therefore, the connecting units provided between adjacent organic EL units are crucial, as they are needed to provide for efficient electron and hole injection into the adjacent organic EL units without compromising the optical transparency. The layer structure of the connecting unit is shown in FIG. 2. It comprises, in sequence, an n-type doped organic layer 131 and a p-type doped organic layer 132. The n-type doped organic layer 131 is adjacent to the ETL of the organic EL unit towards the anode side, and the p-type doped organic layer 132 is adjacent to the HTL of the organic EL unit towards the cathode side. The n-type doped organic layer is selected to provide efficient electron injection into the adjacent electron-transporting layer. The p-type doped organic layer is selected to provide efficient hole-injection into the adjacent hole-transporting layer. Both of the doped layers should have the optical transmission higher than 90% in the visible region of the spectrum. In addition, since the connecting units comprise organic materials, their fabrication method can be identical to the fabrication method of the organic EL units. Preferably, a thermal evaporation method is used for the deposition of all the organic materials in the fabrication of the cascaded OLEDs.

An n-type doped organic layer means that the layer is electrically conductive, and the charge carriers are primarily electrons. The conductivity is provided by the formation of a charge-transfer complex as a result of electron-transfer from the dopant to the host material. Depending on the concentration and the effectiveness of the dopant in donating an electron to the host material, the layer electrical conductivity can change by several orders of magnitude. Likewise, a p-type doped organic layer means that the layer is electrically conductive, and the charge carriers are primarily holes. The conductivity is provided by the formation of a charge-transfer complex as a result of hole-transfer from the dopant to the host material. Depending on the concentration and the effectiveness of the dopant in donating a hole to the host material, the layer electrical conductivity can change by several orders of magnitude. However, in order to not use the pixelated shadow mask for fabricating the organic connecting units and not to cause the pixel cross-talk in the present invention, each of the doped organic layers in the connecting units should have a resistivity higher than 10 Ω-cm. Therefore, the fabrication steps can be simplified and the production rate can be increased.

As will be shown in the examples, if the connecting unit consists of an undoped n-type organic layer and an undoped p-type organic layer, although it is good for optical transparency, this connecting unit cannot provide efficient electron injection or hole injection into the organic EL units. When the connecting unit is thicker than 10 nm, almost no electrons can be injected from the connecting unit into the organic EL units, rendering this connecting unit impractical for use in the cascaded OLEDs.

The n-type doped organic layer in each connecting unit comprises a host organic material and at least one n-type dopant. The host material in the n-typed doped organic layer comprises a small molecule material or a polymeric material, or a combination thereof. It is preferred that this host material can support electron-transport. The p-type doped organic layer in each connecting unit comprises a host organic material and at least one p-type dopant. The host material comprises a small molecule material or a polymeric material, or a combination thereof. It is preferred that this host material can support hole transport. In general, the host material for the n-type doped layer is different from the host material for the p-type doped layer because of the difference in conduction type. But in some instances, some organic materials can be used as a host in either n-type or p-type doped organic layers. These materials are capable of supporting the transport of either holes or electrons. Upon doping with an appropriate n-type or p-type dopant, the doped organic layer would then exhibit primarily either electron-transport properties or hole-transport properties, respectively. The n-type doped concentration or the p-type doped concentration is preferably in the range of 0.01–20 vol. %. The total thickness of each connecting unit is from 1 to 400 nm, preferably in the range of about 1 to 200 nm. The thickness ratio between the n-type doped organic layer and the p-type doped organic layer in the connecting unit is from 1:10 to 10:1, preferably in the range of 1:1 to 1:5.

The electron-transporting materials used in conventional OLEDs represent a useful class of host materials for the n-type doped organic layer. Preferred materials are metal chelated oxinoid compounds, including chelates of oxine itself (also commonly referred to as 8-quinolinol or 8-hydroxyquinoline), such as tris(8-hydroxyquinoline) aluminum. Other materials include various butadiene derivatives as disclosed by Tang (U.S. Pat. No. 4,356,429), various heterocyclic optical brighteners as disclosed by Van Slyke et al. (U.S. Pat. No. 4,539,507), triazines, hydroxyquinoline derivatives, and benzazole derivatives. Silole derivatives, such as 2,5-bis(2',2"-bipridin-6-yl)-1,1-dimethyl-3,4-diphenyl silacyclopentadiene reported by Murata et al. [*Applied Physics Letters*, 80, 189 (2002)], are also useful host materials.

The materials used as the n-type dopants in the n-type doped organic layer of the connecting units include metals or metal compounds having a work function less than 4.0 eV. Particularly useful dopants include alkali metals, alkali metal compounds, alkaline earth metals, and alkaline earth metal compounds. The term "metal compounds" includes organometallic complexes, metal-organic salts, and inorganic salts, oxides and halides. Among the class of metal-containing n-type dopants, Li, Na, K, Rb, Cs, Mg, Ca, Sr, Ba, La, Ce, Sm, Eu, Tb, Dy, or Yb, and their inorganic or organic compounds, are particularly useful. The materials used as the n-type dopants in the n-type doped organic layer of the connecting units also include organic reducing agents with strong electron-donating properties. By "strong electron-donating properties" it is meant that the organic dopant should be able to donate at least some electronic charge to the host to form a charge-transfer complex with the host. Non-limiting examples of organic molecules include bis(ethylenedithio)-tetrathiafulvalene (BEDT-TTF), tetrathiafulvalene (TTF), and their derivatives. In the case of polymeric hosts, the dopant can be any of the above or also a material molecularly dispersed or copolymerized with the host as a minor component.

The hole-transporting materials used in conventional OLEDs represent a useful class of host materials for the p-type doped organic layer. Preferred materials include aromatic tertiary amines having at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Other suitable triarylamines substituted with one or more vinyl radicals and/or comprising at least one active hydrogen-containing group are disclosed by Brantley et al. in U.S. Pat. Nos. 3,567,450 and 3,658,520. A more preferred class of aromatic tertiary amines are those which include at least two aromatic tertiary amine moieties as described by Van Slyke et al. in U.S. Pat. Nos. 4,720,432 and 5,061,569. Non-limiting examples include as N,N'-di(naphthalene-1-yl)-N,N'-diphenyl-benzidine (NPB) and N,N'-diphenyl-N,N'-bis(3-methylphenyl)-1,1-biphenyl-4,4'-diamine (TPD), and N,N,N',N'-tetranaphthyl-benzidine (TNB).

The materials used as the p-type dopants in the p-type doped organic layer of the connecting units are oxidizing agents with strong electron-withdrawing properties. By "strong electron-withdrawing properties" it is meant that the organic dopant should be able to accept some electronic charge from the host to form a charge-transfer complex with the host. Some non-limiting examples include organic compounds such as 2,3,5,6-tetrafluoro-7,7,8,8-tetracyanoquinodimethane ($F_4$-TCNQ) and other derivatives of TCNQ, and inorganic oxidizing agents such as iodine, $FeCl_3$, $FeF_3$, $SbCl_5$, and some other metal halides. In the case of polymeric hosts, the dopant can be any of the above or also a material molecularly dispersed or copolymerized with the host as a minor component.

Examples of materials that can be used as host for either the n-type or p-type doped organic layers include, but are not limited to, various anthracene derivatives as described in U.S. Pat. No. 5,972,247; certain carbazole derivatives, such as 4,4-bis(9-dicarbazolyl)-biphenyl (CBP); and distyrylarylene derivatives such as 4,4'-bis(2,2'-diphenyl vinyl)-1,1'-biphenyl and as described in U.S. Pat. No. 5,121,029.

Improvement of Light Extraction

Since there is more than one organic EL unit in the cascaded OLED, it is important to have a good optical design for the improvement of the light extraction from the device by considering the optical dual-path interference between the direct beam from the LEL and the reflected beam from the reflective electrode. Improved light extraction can be achieved by adjusting the optical distance between the electroluminescent zone in each of the organic EL units and the reflective electrode.

In the present invention an optical thickness "s(i)" of an organic thin film is defined as a product of "d(i)" and "n(i)"

$$s(i)=d(i)n(i) \tag{Eq. 1}$$

where "d(i)" is the physical thickness of the $i^{th}$ organic thin film, and "n(i)" is the refractive index of the $i^{th}$ organic thin film corresponding to a certain emitting wavelength.

In the $j^{th}$ EL unit having "k" layers of organic films, the optical thickness "$s_j$" is the sum of the optical thickness' "s(i)"

$$s_j = \sum_{i=1}^{k} s(i) = \sum_{i=1}^{k} d(i)n(i) \tag{Eq. 2}$$

where "i" is the layer index number running from i=1 to i=k.

Similarly, in the $j^{th}$ connecting unit having "l" layers of organic films, the optical thickness "$s_j$" is the sum of the optical thickness' "s(i)"

$$s_j = \sum_{i=1}^{l} s(i) = \sum_{i=1}^{l} d(i)n(i) \tag{Eq. 3}$$

where "i" is the layer index number running from i=1 to i=l.

For the purpose of calculating the optical distance between the electroluminescent zone in each of the organic EL units and the reflective electrode, a position called "emitting central plane" which is the middle position of the electroluminescent zone is defined. The present invention also defines the physical distance from the emitting central plane to its shortest adjacent HTL/LEL interface position as "p". Therefore, the optical thickness from the original $q^{th}$ emitting central plane to the end of its $q^{th}$ EL unit towards the reflective electrode side is defined as $L_q$. Suppose the $q^{th}$ EL unit consists of HTL/LEL/ETL, $L_q$ can be expressed as $$L_q=[d(LEL)-p]n(LEL)+d(ETL)n(ETL).$$

where "p" is equal to half of the thickness of the electroluminescent zone.

The optical distance "$S_q$" from the $q^{th}$ electroluminescent zone to the reflective electrode is the sum of the optical thickness' s(i,j) of all the layers through which the light beam passes between the emitting central plane and the reflective electrode. "$S_q$" is expressed as a sum of three terms $$S_q = L_q + \sum_{j=q+1}^{N} \sum_{i=1}^{k} d(i,j)n(i,j) + \sum_{j=q+1}^{N-1} \sum_{i=1}^{l} d(i,j)n(i,j) \tag{Eq. 4}$$

where "i" is the layer index number within each EL unit running from i=1 to i=k, and within each connecting unit running from i=1 to i=l. "j" is the index number for the EL units running from j=q+1 to j=N, and for the connecting units running from j=q+1 to j=(N−1) in the cascaded OLED. d(i,j) is the physical thickness of the $i^{th}$ organic layer in the $j^{th}$ EL unit or in the $j^{th}$ connecting unit. n(i,j) is the refractive index of the $i^{th}$ organic layer in the $j^{th}$ EL unit or in the $j^{th}$ connecting unit. The names of organic layers may be used to replace the "i" index number for convenient description of the examples in the present invention.

In order to optimize the light extraction, the optical distance between the emitting central plane of the $q^{th}$ EL unit and the reflective electrode should be equal to $$S_q = L_q + \sum_{j=q+1}^{N} \sum_{i=1}^{k} d(i,j)n(i,j) + \sum_{j=q+1}^{N-1} \sum_{i=1}^{l} d(i,j)n(i,j) \tag{Eq. 5}$$

$$= (2m_q + \eta)\lambda(q)/4$$

$$= S_{q,O}$$

where $S_{q,O}$ is denoted as the optimal optical distance between the emitting central plane of the $q^{th}$ EL unit and the reflective electrode. $m_q$ is an integer equal to 0, 1, 2, 3, or larger, $\lambda(q)$ is the peak emission wavelength of the emitting layer in the $q^{th}$ EL unit, and $\eta$ is a coefficient determined by the change of the light wave phase after reflected from the reflective electrode $$\eta = \Phi/180 \tag{Eq. 6}$$

where $\Phi$ is the light wave phase shift after reflected from the reflective electrode. $\eta$ can be either calculated based on the refractive index of both the electrode material and the contacted organic material or estimated experimentally from a conventional reference OLED with optimal light extraction. $\eta$ is typically in the range of from 0.6 to 1.0.

FIG. 3 illustrates the dual-path interference present in a cascaded OLED. Cascaded OLED 200 is the same as cascaded OLED 100, with the exception that electrode 240 is a reflective electrode, and electrode 210 is a transmissive electrode on a transmissive substrate 250. The light generated inside the device can only exit through the transmissive electrode 210 and the transmissive substrate 250. The light emitted from each electroluminescent zone undergoes a dual-path to exit the device. As an example, FIG. 3 shows the dual-path of the emitting light from the electroluminescent zones of the second EL unit 120.2 and the $(N-1)^{th}$ EL unit 120.(N−1). In EL unit 120.2, the light beam traveling towards the reflective electrode 240 with a wavelength of $\lambda(2)$ is reflected from the reflective electrode after it traveled an optical distance of $S_2$. If $S_2$ can meet the requirement of $(2m_2+\eta) \times \lambda(2)/4$, optimized light extraction can be obtained from this EL unit. Likewise, in EL unit 120.(N−1), the light beam traveling towards the reflective electrode 240 with a wavelength of $\lambda(N-1)$ is reflected from the reflective electrode after it traveled an optical distance of $S_{N-1}$. If $S_{N-1}$ can meet the requirement of $(2m_{N-1}+\eta) \times \lambda(N-1)/4$, optimized light extraction can be obtained from this EL unit. Following this process, the light extraction from each EL unit in the cascaded OLED 200 can be optimized according to Equation 5, with a known value of $\eta$, a known value of $\lambda$, and a specified value of m.

According to the physical location of the EL unit related to the reflective electrode 240, the closer the $q^{th}$ EL unit, the smaller the $S_{q,O}$ is. Moreover, from a real device point of view, in order to save organic materials and reduce driving voltage, $S_{q,O}$ or $m_q$ should preferably be selected to be as small as possible, and at the same time the requirement of $S_{q-1,O} > S_{q,O} > S_{q+1,O}$ should be met.

If each of the EL units in the cascaded OLED 200 emits light with the same wavelength $\lambda$, then $m_q$ can be selected as $$m_q = N - q \tag{Eq. 7}$$

and Equation 5 can be specified as $$S_{q,O} = (2 \times (N-q) + \eta) \times \lambda/4 \tag{Eq. 8}$$

For the $N^{th}$ EL unit, $S_{N,O} = \eta \times \lambda/4$, and for the 1$^{st}$ EL unit, $S_{1,O} = (2 \times (N-1) + \eta) \times \lambda/4$. In the present invention, $\eta$ is experimentally estimated from a conventional reference OLED.

Considering possible variations in the determination of the layer thickness, their refractive indexes, and the interface condition between the reflective electrode and the contacted organic layer, the optimal optical distance between the original emitting central plane of the $q^{th}$ EL unit and the reflective electrode can be in a range of from $S_{q,O}=0.8\times[(2m_q+\eta)\times\lambda(q)/4]$ to $S_{q,O}=1.2\times[(2m_q+\eta)\times\lambda(q)/4]$, more conveniently, it can be in a range of from $S_{q,O}=0.8\times[(2m_q+1)\times\lambda(q)/4]$ to $S_{q,O}=1.2\times[(2m_q+1)\times\lambda(q)/4]$. Therefore, the optimal physical thickness between the original emitting central plane of the $q^{th}$ EL unit and the reflective electrode can be calculated accordingly.

If two adjacent EL units in the cascaded OLED 200 emit the light with the same wavelength λ, the optimal optical thickness between the adjacent electroluminescent zones is equal to $$S_{q+1,O}-S_{q,O}=(2\times(N-q+1)+\lambda/4-(2\times(N-q)+\eta)\times\lambda/4=\lambda/2 \quad \text{(Eq. 9)}$$

In the visible spectral range from 400 nm to 800 nm, the optimal optical thickness between the adjacent electroluminescent zones of the same wavelength λ is in the range of from 200 nm to 400 nm. Since the refractive indexes of the organic materials used in the cascaded OLED are in the range of 1.5~2.2, the optimal physical spacing (or physical thickness) between the adjacent electroluminescent zones should be more than 90 nm. If two adjacent EL units in the cascaded OLED 200 emit light with different wavelengths, the optimal physical spacing between the adjacent electroluminescent zones should also be more than 90 nm by considering the feasible thicknesses of the layers in the real device structures.

The optimal optical distance can be adjusted by changing either the thicknesses of the EL units or the thicknesses of the connecting units. Since each of the doped organic layers in the connecting units have relatively lower bulk resistivity than that of the EL units, it is advantageous to adjust the optical distance by changing the thicknesses of the connecting units, or their refractive indexes, if necessary, while keeping a minimal thickness of the EL units.

Common Device Features

Substrate

The cascaded OLED of the present invention is typically provided over a supporting substrate where either the cathode or anode can be in contact with the substrate. The electrode in contact with the substrate is conveniently referred to as the bottom electrode. Conventionally, the bottom electrode is the anode, but the present invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Of course, it is necessary to provide in these device configurations a light-transparent top electrode.

Anode

When EL emission is viewed through anode 110, the anode should be transparent or substantially transparent to the emission of interest. Common transparent anode materials used in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, can be used as the anode. For applications where EL emission is viewed only through the cathode electrode, the transmissive characteristics of the anode are immaterial and any conductive material can be used, regardless if it is transparent, opaque or reflective. Example conductors for this application include, but are not limited to, gold, iridium, molybdenum, palladium, and platinum. Typical anode materials, transmissive or otherwise, have a work function higher than 4.0 eV. Desired anode materials are commonly deposited by any suitable means such as evaporation, sputtering, chemical vapor deposition, or electrochemical means. Anodes can be patterned using well known photolithographic processes. Optionally, anodes may be polished prior to the deposition of other layers to reduce surface roughness so as to minimize electrical shorts or enhance reflectivity.

Hole-Injecting Layer (HIL)

While not always necessary, it is often useful to provide a HIL in the $1^{st}$ organic EL unit to contact the anode 110. The HIL can serve to improve the film formation property of subsequent organic layers and to facilitate injection of holes into the HTL reducing the driving voltage of the cascaded OLED. Suitable materials for use in the HIL include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4''-tris[(3-ethylphenyl)phenylamino]triphenylamine). A p-type doped organic layer for use in the aforementioned connecting unit is also useful for the HIL as described in U.S. Pat. No. 6,423,429 B2. Alternative hole-injecting materials reportedly useful in organic EL devices are described in EP 0 891 121 A1 and EP 1 029 909 A1.

Hole-Transporting Layer (HTL)

The HTL in organic EL units contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen-containing group are disclosed by Brantley et al. U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The HTL can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl] amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the LEL in organic EL units includes a luminescent or fluorescent material where electroluminescence is produced as a result of electron-hole pair recombination in this region. The LEL can be comprised of a single material, but more commonly consists of a host material doped with a guest compound or compounds where light emission comes primarily from the dopant and can be of any color. The host materials in the LEL can be an electron-transporting material, a hole-transporting material, or another material or combination of materials that support hole-electron recombination. The dopant is usually selected from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes, e.g., poly(p-phenylenevinylene), PPV, can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the electron energy band gap. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo{f}-8-quinolinolato]zinc (II)

CO-4: Bis(2-methyl-8-quinolinolato)aluminum(III)-$\mu$-oxo-bis(2-methyl-8-quinolinolato) aluminum(III)

CO-5: Indium trisoxine [alias, tris(8-quinolinolato) indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato) zirconium(IV)]

Other classes of useful host materials include, but are not limited to, derivatives of anthracene, such as 9,10-di-(2-naphthyl)anthracene and derivatives thereof as described in U.S. Pat. No. 5,935,721, distyrylarylene derivatives as described in U.S. Pat. No. 5,121,029, and benzazole derivatives, for example, 2,2',2"-(1,3,5-phenylene)tris[1-phenyl-1H-benzimidazole]. Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis (azinyl)methane compounds, and carbostyryl compounds.

Electron-Transporting Layer (ETL)

Preferred thin film-forming materials for use in forming the ETL in the organic EL units of the present invention are metal chelated oxinoid compounds, including chelates of oxine itself, also commonly referred to as 8-quinolinol or 8-hydroxyquinoline. Such compounds help to inject and transport electrons, exhibit high levels of performance, and are readily deposited to form thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

Organic Electron-Injecting Layer (EIL)

While not always necessary, it is often useful to provide an EIL in the N-th organic EL unit to contact the cathode 140. The EIL can serve to facilitate injection of electrons into the ETL and to increase the electrical conductivity resulting in a low driving voltage of the cascaded OLED. Suitable materials for use in the EIL are the aforementioned ETL's doped with strong reducing agents or low work-function metals (<4.0 eV) as described in the aforementioned n-type doped organic layer for use in the connecting units. Alternative inorganic electron-injecting materials can also be useful in the organic EL unit, which will be described in following paragraph.

Cathode

When light emission is viewed solely through the anode, the cathode 140 used in the present invention can be comprised of nearly any conductive material. Desirable materials have good film-forming properties to ensure good contact with the underlying organic layer, promote electron injection at low voltage, and have good stability. Useful cathode materials often contain a low work-function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin inorganic EIL in contact with an organic layer (e.g., ETL), which is capped with a thicker layer of a conductive metal. Here, the inorganic EIL preferably includes a low work-function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862; and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211; 5,247,190; 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459; 6,278,236; 6,284,393; JP 3,234,963; and EP 1 076 368. Cathode materials are typically deposited by thermal evaporation, electron-beam evaporation, ion sputtering, or chemical vapor deposition. When needed, patterning can be achieved through many well known methods including, but not limited to, through-mask deposition, integral shadow masking, for example as described in U.S. Pat. No. 5,276,380 and EP 0 732 868, laser ablation, and selective chemical vapor deposition.

Other Device Features

Alternative Layers

In some instances, LEL and ETL in the organic EL units can optionally be collapsed into a single layer that serves the function of supporting both light emission and electron-transportation. It is also known in the art that emitting dopants may be added to the HTL, which may serve as a host. Multiple dopants may be added to one or more layers in order to create a white-emitting OLED, for example, by combining blue- and yellow-emitting materials, cyan- and red-emitting materials, or red-, green-, and blue-emitting materials. White-emitting devices are described, for example, in U.S. Patent Application Publication 2002/0025419 A1; U.S. Pat. Nos. 5,683,823; 5,503,910; 5,405,709; 5,283,182; EP 1 187 235; and EP 1 182 244.

Additional layers such as electron or hole-blocking layers as taught in the art may be employed in devices of the present invention. Hole-blocking layers are commonly used to improve efficiency of phosphorescent emitter devices, for example, as in U.S. Patent Application Publication 2002/0015859 A1.

Deposition of Organic Layers

The organic materials mentioned above are suitably deposited through a vapor-phase method such as thermal evaporation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by thermal evaporation can be vaporized from an evaporation "boat" often comprised of a tantalum material, e.g., as described in U.S. Pat. No. 6,237,529, or can be first coated onto a donor sheet and then sublimed in closer proximity to the substrate. Layers with a mixture of materials can utilize separate evaporation boats or the materials can be pre-mixed and coated from a single boat or donor sheet. For full color display, the pixelation of LELs may be needed. This pixelated deposition of LELs can be achieved using shadow masks, integral shadow masks (U.S. Pat. No. 5,294,870), spatially-defined thermal dye transfer from a donor sheet (U.S. Pat. Nos. 5,688,551; 5,851,709; and 6,066,357) and inkjet method (U.S. Pat. No. 6,066,357). For other organic layers either in the organic EL units or in the connecting units, pixelated deposition is not necessarily needed.

Encapsulation

Most OLEDs are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

The entire contents of the patents and other publications referred to in this specification are incorporated herein by reference.

EXAMPLES

The following examples are presented for a further understanding of the present invention. For purposes of brevity, the materials and layers formed therefrom will be abbreviated as given below.

ITO: indium-tin-oxide; used in forming the transparent anode on glass substrates CFx: polymerized fluorocarbon layer; used in forming a hole-injecting layer on top of ITO NPB: N,N'-di(naphthalene-1-yl)-N,N'-diphenyl-benzidine; used in forming the hole transporting layer in the organic EL unit, and also used as the host in forming the p-type doped organic layer in the connecting unit. 1.81 is taken as its refractive index in the following examples.

Alq: tris(8-hydroxyquinoline)aluminum(III); used both as the host in forming the light-emitting layer and in forming the electron-transporting layer in the organic EL unit, and also used as host in forming the n-type doped organic layer in the connecting unit. 1.73 is taken as its refractive index in the following examples.

C545T: 10-(2-benzothiazolyl)-1,1,7,7-tetramethyl-2,3,6,7-tetrahydro-1H,5H,11H(1)benzopyrano(6,7,8-ij)quinolizin-11-one; used as a green dopant in the light-emitting layer in the EL unit.

$FeCl_3$: Iron (III) chloride; used as p-type dopant in forming the p-type doped organic layer in the connecting unit.

Li: Lithium; used as n-type dopant in forming the n-type doped organic layer in the connecting unit.

Mg:Ag: magnesium:silver at a ratio of 10:0.5 by volume; used in forming the cathode.

The electroluminescence characteristics of all the fabricated devices were evaluated using a constant current source and a photometer at room temperature.

Example 1 (Conventional OLED—Comparative)

The preparation of a conventional non-cascaded OLED is as follows: A ~1.1 mm thick glass substrate coated with a transparent ITO conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A layer of CFx, 1 nm thick, was deposited on the clean ITO surface as the HIL by decomposing $CHF_3$ gas in an RF plasma treatment chamber. The substrate was then transferred into a vacuum deposition chamber for deposition of all other layers on top of the substrate. The following layers were deposited in the following sequence by sublimation from a heated boat under a vacuum of approximately $10^{-6}$ Torr:

(1) a HTL, 90 nm thick, consisting of NPB;
(2) a LEL, 20 nm thick, consisting of Alq host doped with 1.0 vol. % C545T;
(3) an ETL, 40 nm thick, consisting of Alq; and
(4) a reflective cathode, approximately 210 nm thick, consisting of Mg:Ag.

After the deposition of these layers, the device was transferred from the deposition chamber into a dry box for encapsulation. The completed device structure is denoted as ITO/CFx/NPB(90)/Alq:C545T(20)/Alq(40)/Mg:Ag.

In this device (with only one EL unit), the peak emission wavelength λ(l) from the LEL is 524 nm. The thickness of the electroluminescent zone is defined as 10 nm, and p is then equal to 5 nm. The physical thickness between the emitting central plane and the Mg:Ag reflective cathode is 55 nm, which is an optimal value obtained from our other experiments. According to Equations 4 and 5, when ml is selected as 0, η can be calculated as $$\eta = 4 \times S_{1,O}/\lambda(1)$$
$$= 4 \times [s(LEL, 1) - p + s(ETL, 1)] \times n(Alq, 1)/\lambda(1)$$
$$= 4 \times [20 - 5 + 40] \times 1.73/524$$
$$= 0.726$$

This experimental η value will be used in the following examples.

Figure 4:
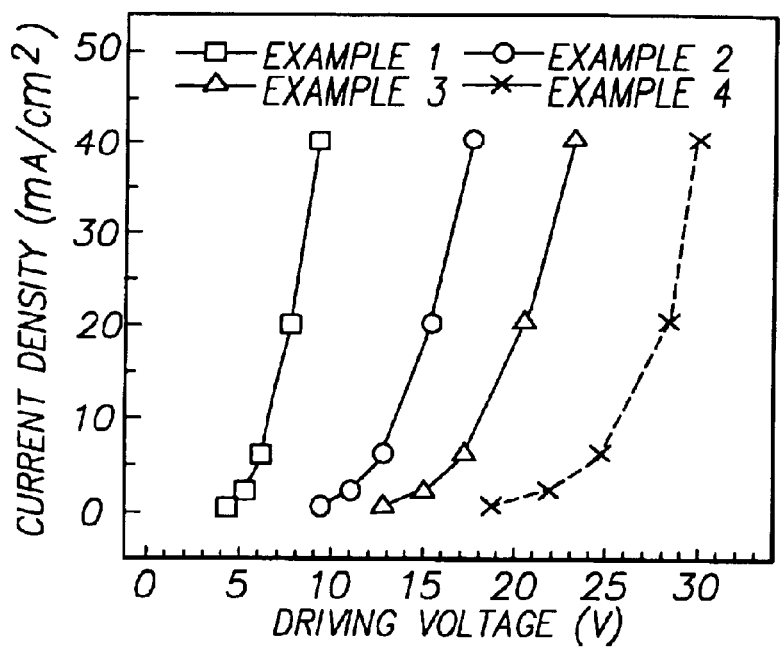
FIG. 4 is a graph of current density vs. driving voltage in accordance with the present invention as well as the reference devices measured at the room temperature.
Figure 5:
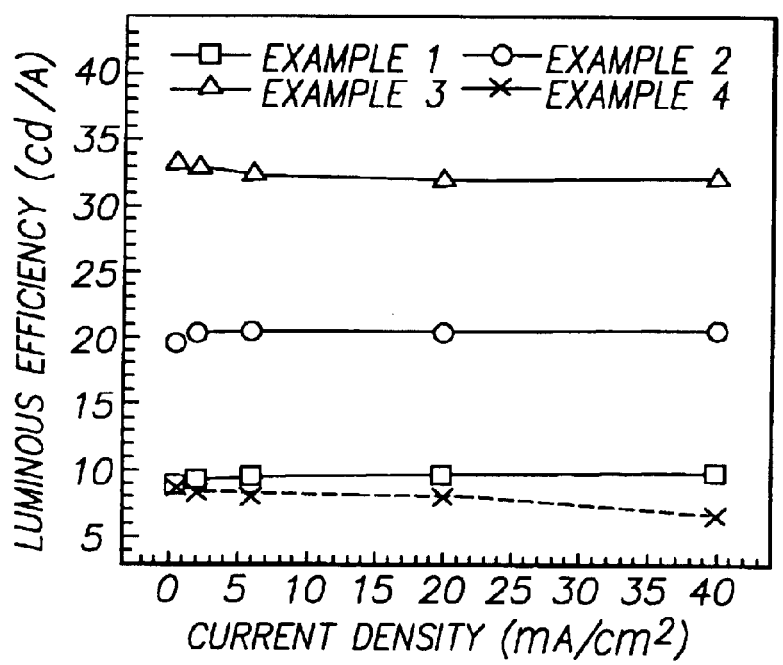
FIG. 5 is a graph of luminous efficiency vs. current density in accordance with the present invention as well as the reference devices measured a room temperature.

This device requires a driving voltage of about 7.0 V to pass 20 mA/cm². Its luminance is 1905 cd/m² and its luminous efficiency is about 9.5 cd/A. The current density vs. driving voltage (I-V curve) is shown in FIG. 4, and the luminous efficiency vs. current density is shown in FIG. 5.

Example 2 (Inventive)

The preparation of a cascaded OLED with two EL units is as follows: A ~1.1 mm thick glass substrate coated with a transparent ITO conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A layer of CFx, 1 nm thick, was deposited on the clean ITO surface as the HIL by decomposing $CHF_3$ gas in an RF plasma treatment chamber. The substrate was then transferred into a vacuum deposition chamber for deposition of all other layers on top of the substrate. The following layers were deposited in the following sequence by sublimation from a heated boat under a vacuum of approximately $10^{-6}$ Torr:

(1) a first HTL, 60 nm thick, consisting of NPB as a spacer between transparent anode and the first EL unit;
(2) a HTL, 30 nm thick, consisting of NPB;
(3) a LEL, 20 nm thick, consisting of Alq host doped with 1.0 vol. % C545T;
(4) an ETL, 10 nm thick, consisting of Alq;
[NPB(30)/Alq:C545T(20)/Alq(10), denoted as EL, consists of the $1^{st}$ EL unit];
(5) a n-type doped organic layer, 30 nm thick, consisting of Alq host doped with 1.2 vol. % Li;
(6) a p-type doped organic layer, 60 nm thick, consisting of NPB host doped with 1 vol. % $FeCl_3$;
[Li doped Alq(30)/$FeCl_3$ doped NPB(60), denoted as CU, consists of the $1^{st}$ connecting unit];
(7) a HTL, 30 nm thick, consisting of NPB;
(8) a LEL, 20 nm thick, consisting of Alq host doped with 1.0 vol. % C545T;
(9) an ETL, 10 nm thick, consisting of Alq;
[NPB(30)/Alq:C545T(20)/Alq(10), denoted as EL, consists of the $2^{nd}$ EL unit];
(10) a last ETL, 30 nm thick, consisting of Alq as a spacer between the last EL unit and the reflective cathode; and
(11) a reflective cathode, approximately 210 nm thick, consisting of Mg:Ag.

After the deposition of these layers, the device was transferred from the deposition chamber into a dry box for encapsulation. The completed device structure is denoted as ITO/CFx/NPB(60)/EL/CU/EL/Alq(30)/Mg:Ag.

In this cascaded OLED, the connecting unit has a resistivity higher than 10 Ω-cm and an optical transmission higher than 90%. The peak emission wavelength λ from each LEL is 524 nm. According to Equation 4, the optical distance between the emitting central plane of the $2^{nd}$ EL unit and the reflective Mg:Ag cathode is $S_2$=[d(LEL,2)−p+d(ETL,2)+d(Spacer,2)]×n(Alq,2)=[15−5+10+40]×1.73=95 nm. According to Equation 8, $S_{q,O}$=(2×(N−q) +η)×λ/4, and according to Example 1 wherein η is 0.726, the optimal optical distance $S_{2,O}$=η×λ/4=0.726×524/4=95 nm. Therefore, $S_2 \times S_{2,O}$, i.e. the real optical distance between the emitting central plane of the $2^{nd}$ EL unit and the reflective Mg:Ag cathode has been optimized. Likewise, the optical distance between the emitting central plane of the $1^{st}$ EL unit and the reflective Mg:Ag cathode is $S_1$=[(d(LEL,1)−p)×n(Alq,1)+d(ETL,1)×n(Alq,1)]+[d(n−L,1)×n(Alq,1)+d(p−L,1)×n(NPB,1)]+[d(HTL,2)×n(NPB,2)+d(LEL,2)×n(Alq,2)+d(ETL,2)×n(Alq,2)]+[d(Spacer,2)×n(Alq,2)]=[(20−5)×1.73+10×1.73]+[30×1.73+60×1.81]+[30×1.81+20×1.73+10×1.73]+[30×1.73]=115×1.73+90×1.81=362 nm. According to Equation 8, $S_{q,O}$=(2×(N−q)+η)×λ/4, and according to Example 1 wherein η is 0.726, the optimal optical distance $S_{1,O}$=(2+η)×λ/4=2.726×524/4=357 nm. Therefore, $S_1$=1.01×$S_{1,O}$, i.e. the real optical distance between the emitting central plane of the $1^{st}$ EL unit and the reflective Mg:Ag cathode has been optimized. Moreover, the physical spacing between the emitting central plane of the $1^{st}$ EL unit and the emitting central plane of the $2^{nd}$ EL unit is 150 nm, which is corresponding to an optical distance of λ/2 in the device.

This cascaded OLED requires a driving voltage of 14.3 V to pass 20 mA/cm². Its luminance is 4073 cd/m² and its luminous efficiency is about 20.4 cd/A, both of which are twice as high as those of Example 1. The I-V curve is shown in FIG. 4, and the luminous efficiency vs. current density is shown in FIG. 5.

Example 3 (Inventive)

A cascaded OLED with three EL units was fabricated as the same as Example 2 except that after step (9) in Example 2, steps (5) to (9) are repeated once to add one more connecting unit and one more EL unit, followed by steps (10) and (11).

After the deposition of these layers, the device was transferred from the deposition chamber into a dry box for encapsulation. The completed device structure is denoted as ITO/CFx/NPB(60)/EL/CU/EL/CU/EL/Alq(30)/Mg:Ag.

In this cascaded OLED, the same as )in Example 2, the connecting unit has a resistivity higher than 10 Ω-cm and an optical transmission higher than 90%. The peak emission wavelength λ from each LEL is 524 nm. $S_3=S_{3,O}=95$ nm, $S_2=1.01 \times S_{2,O}=362$ nm, and $S_1=1.02 \times S_{1,O}=1.02 \times 619=629$ nm. The optical distances from each emitting central plane to the reflective Mg:Ag cathode have been optimized. Moreover, the physical spacing between each of the emitting central planes is 150 nm, which is corresponding to an optical distance of λ/2 in the device.

This cascaded OLED requires a driving voltage of about 20.0 V to pass 20 mA/cm². Its luminance is 6381 cd/m² and its luminous efficiency is about 31.9 cd/A, both of which are three times as high as those of Example 1. The I-V curve is shown in FIG. 4, and the luminous efficiency vs. current density is shown in FIG. 5.

Example 4 (Comparative)

An OLED with three EL units was fabricated as the same as Example 3 except that there are no steps (5) and (6), which means there is no connecting unit between each of the EL units in the device.

After the deposition of these layers, the device was transferred from the deposition chamber into a dry box for encapsulation. The completed device structure is denoted as ITO/CFx/NPB(60)/EL/EL/EL/Alq(30)/Mg:Ag.

This cascaded OLED requires a driving voltage of about 27.0 V to pass 20 mA/cm². Its peak emission wavelength λ is 524 nm. Its luminance is 1597 cd/m² and its luminous efficiency is about 8.0 cd/A, both of which are lower than those of Example 1. The I-V curve is shown in FIG. 4, and the luminous efficiency vs. current density is shown in FIG. 5.

Comparing with Example 3, the device of Example 4 requires 7 volts higher driving voltage to pass 20 mA/cm², although its total thickness is 180 nm less than that of Example 3. Moreover, its luminance is less than one third of that of Example 3. In this device, without the connecting unit comprising an n-type doped organic layer and a p-type doped organic layer, the connection between each of the EL units is substituted by an undoped n-type organic layer (Alq layer) and an undoped organic layer (NPB layer). These undoped layers form an undoped p-n junction structure. It is indicated from the device performance that the undoped p-n junction structure cannot provide efficient carrier transport and carrier injection into the EL units. It further demonstrates that the connecting unit comprising the doped organic p-n junction structure and providing efficient carrier injection is very critical to the cascaded OLED.

Example 5 (Inventive)

A cascaded OLED with two EL units was fabricated as the same as Example 2 except that the thickness of the first HTL in step (1) was changed from 60 nm to 135 nm.

After the deposition of these layers, the device was transferred from the deposition chamber into a dry box for encapsulation. The completed device structure is denoted as ITO/CFx/NPB(135)/EL/CU/EL/Alq(30)/Mg:Ag.

In this cascaded OLED, just as in Example 2, the connecting unit has a resistivity higher than 10 Ω-cm and an optical transmission higher than 90%. The peak emission wavelength λ from each LEL is 524 nm. $S_2=S_{2,O}=95$ nm and $S_1=1.01 \times S_{1,O}=362$ nm. The optical distances from each emitting central plane to the reflective Mg:Ag cathode have been optimized. Moreover, the physical spacing between each of the emitting central planes is 150 nm, which corresponds to an optical distance of λ/2 in the device.

This cascaded OLED requires a driving voltage of about 17.7 V to pass 20 mA/cm². Its luminance is 3847 cd/m² and its luminous efficiency is about 19.2 cd/A, both of which are twice as high as those of Example 1.

Example 6 (Comparative)

A cascaded OLED with two EL units was fabricated as the same as Example 5 except that the thickness of the connecting unit was changed: The thickness of the Li doped Alq layer was changed from 30 nm to 55 nm in step (5) and the thickness of the FeCl₃ doped NPB layer was changed from 60 nm to 110 nm. The Alq:Li(55 nm)/NPB:FeCl₃(110 nm), denoted as CU2, consists of the connecting unit in the device.

After the deposition of these layers, the device was transferred from the deposition chamber into a dry box for encapsulation. The completed device structure is denoted as ITO/CFx/NPB(135)/EL/CU2/EL/Alq(30)/Mg:Ag.

In this cascaded OLED, just as in Example 5, the connecting unit has a resistivity higher than 10 Ω-cm and an optical transmission higher than 90%. The peak emission wavelength λ is 524 nm. Because $S_2=S_{2,O}=95$ nm, the optical distance from the emitting central plane of the $2^{nd}$ EL unit to the reflective Mg:Ag cathode has been optimized. However, $S_1=1.38 \times S_{1,O}=495$ nm, which indicated that the optical distance from the emitting central plane of the $1^{St}$ EL unit to the reflective Mg:Ag cathode has a substantial deviation from the optimal value.

This cascaded OLED requires a driving voltage of about 18.0 V to pass 20 mA/cm². Its luminance is 2037 cd/m² and its luminous efficiency is about 10.2 cd/A, both of which are almost the same as those of Example 1.

In fact, the physical spacing between the two emitting central planes in this device is 225 nm, which is corresponding to an optical distance of 1.5×λ/2 in the device. According to the behavior of the dual-path interference, there is a wave phase difference of 180° between the direct beam from the LEL of the $1^{st}$ EL unit and the reflected beam originated from the same LEL and then reflected from the Mg:Ag cathode when the reflected beam pass the original emitting position. As a result, this interference totally eliminated the emission contribution from the $1^{st}$ EL unit. Therefore, this cascaded OLED with two EL unit only can get the light emission from the $2^{nd}$ EL unit although there is a connecting unit providing efficient carrier injection in the device. This demonstrates that the optical design of the connecting unit and the EL unit is also very critical to the cascaded OLED.

The above examples demonstrate that significant increase in luminance efficiency can be achieved in the cascaded OLED by using a doped organic p-n junction structure to provide efficient carrier injection into the EL units and also by carefully adjusting the optical interference in the device.

The present invention has been described in detail with particular reference to certain preferred embodiments thereof, but it will be understood that variations and modifications can be effected within the spirit and scope of the invention.

PARTS LIST 100 cascaded OLED
110 anode
120 EL unit
120.1 $1^{st}$ EL unit
120.2 $2^{nd}$ EL unit
120.(N-1) $(N-1)^{th}$ EL unit
120.N $N^{th}$ EL unit
130 connecting unit
130.1 $1^{st}$ connecting unit
130.2 $2^{nd}$ connecting unit
130.(N-1) $(N-1)^{th}$ connecting unit
131 n-type doped organic layer
132 p-type doped organic layer
140 cathode
150 voltage/current source
160 electrical conductors
200 cascaded OLED
210 transmissive electrode
240 reflective electrode
250 transmissive substrate

What is claimed is:

1. A cascaded organic electroluminescent device comprising:
   a) an anode;
   b) a cathode;
   c) a plurality of organic electroluminescent units disposed between the anode and the cathode, wherein the organic electroluminescent units comprise at least a hole-transporting layer, an electron-transporting layer, and an electroluminescent zone formed between the hole-transporting layer and the electron-transporting layer wherein the physical spacing between adjacent electroluminescent zones is more than 90 nm; and
   d) a connecting unit disposed between each adjacent organic electroluminescent unit, wherein the connecting unit comprises, in sequence, an n-type doped organic layer and a p-type doped organic layer forming a transparent p-n junction structure wherein the resistivity of each of the doped layers is higher than 10 Ω-cm.

2. The cascaded organic electroluminescent device of claim 1 wherein each connecting unit has at least a 90% optical transmission in the visible region of the spectrum.

3. The cascaded organic electroluminescent device of claim 1 wherein the thickness of each connecting unit is in a range of from 1 to 400 nm.

4. The connecting unit of claim 1 wherein the thickness ratio between the n-type doped organic and the p-type doped organic layer is in a range of from 1:10 to 10:1.

5. The cascaded organic electroluminescent device of claim 1 wherein the anode or cathode is a reflective electrode and the optical distance from the electroluminescent zone of each organic electroluminescent unit to the reflective electrode is selected in the range from $0.8 \times [(2m+1) \times (\lambda/4)]$ to $1.2 \times [(2m+1) \times (\lambda/4)]$, wherein m is an integer of 0, 1, 2, 3, or larger, and $\lambda$ is the peak emission wavelength of the electroluminescent unit.

6. The cascaded organic electroluminescent device of claim 1 wherein anode or cathode is a reflective electrode and the optical distance from the electroluminescent zone of each organic electroluminescent unit to the reflective electrode is selected as $[(2m+\eta) \times (\lambda/4)]$ so that the light extraction can be optimized, wherein m is an integer of 0, 1, 2, 3, or larger, $\eta$ is a coefficient selected in the range of from 0.6 to 1.0, and $\lambda$ is the peak emission wavelength of the electroluminescent unit.

7. The cascaded organic electroluminescent device of claim 1 wherein anode or cathode is a reflective electrode and the physical spacing between the electroluminescent zone of each organic electroluminescent unit and the reflective electrode is selected in accordance with the corresponding optical distance.

8. The cascaded organic electroluminescent device of claim 1 wherein the physical spacing between each electroluminescent zone of the electroluminescent units is selected to improve the light extraction from the electroluminescent device.

9. The cascaded organic electroluminescent device of claim 1 wherein anode or cathode is a reflective electrode and the physical spacing from the electroluminescent zone of each organic electroluminescent unit to the reflective electrode is adjusted by changing the thickness of the connecting unit.

10. The cascaded organic electroluminescent device of claim 1 wherein anode or cathode is a reflective electrode and the physical spacing from the electroluminescent zone of each organic electroluminescent unit to the reflective electrode is adjusted by choosing the host materials of the connecting unit with suitable refraction indexes.

* * * * *